United States Patent [19]
Jorgensen

[11] 3,984,703
[45] Oct. 5, 1976

[54] CMOS SCHMITT TRIGGER

[75] Inventor: John M. Jorgensen, Santa Clara, Calif.

[73] Assignee: National Semiconductor Corporation, Santa Clara, Calif.

[22] Filed: June 2, 1975

[21] Appl. No.: 582,901

[52] U.S. Cl. .............................. 307/279; 307/205; 307/214; 307/290
[51] Int. Cl.² .................. H03K 3/295; H03K 19/08; H03K 19/40
[58] Field of Search ........... 307/205, 214, 279, 288, 307/290

[56] References Cited
UNITED STATES PATENTS

| | | | |
|---|---|---|---|
| 3,651,342 | 3/1972 | Dingwall | 307/304 X |
| 3,739,193 | 6/1973 | Pryor | 307/205 |
| 3,812,384 | 5/1974 | Skorup | 307/214 X |
| 3,873,856 | 3/1975 | Gerlach | 307/279 |
| 3,904,888 | 9/1975 | Griffin et al. | 307/279 X |

Primary Examiner—John S. Heyman
Assistant Examiner—Larry N. Anagnos
Attorney, Agent, or Firm—Lowhurst & Aine

[57] ABSTRACT

The input of the Schmitt trigger is applied in parallel to the gates of a plurality of stacked MOS transistors. The stacked transistors are connected with their respective source and drain electrodes in series with a source of potential and with the drain electrode of a p channel transistor being connected to the adjacent drain electrode of an n channel transistor to define an output node on which the output hysteresis signal is derived. Upper and lower trip point reference potentials are established on the respective source electrodes of said output node defining p and n channel transistors. At least one of the trip point reference potentials is gated to the respective source electrode as a function of the state of the output, i.e., whether the output is high or low. The input signal is compared in the stack with the established trip point reference potentials to derive the upper and lower trip points dependent upon the sign of the change in the potential of the input signal to produce hysteresis in the transfer function of the device. The output hysteresis signal is inverted and a portion of the inverted output signal is fed back via a second inverter to the output node for stabilizing the output signal.

10 Claims, 5 Drawing Figures

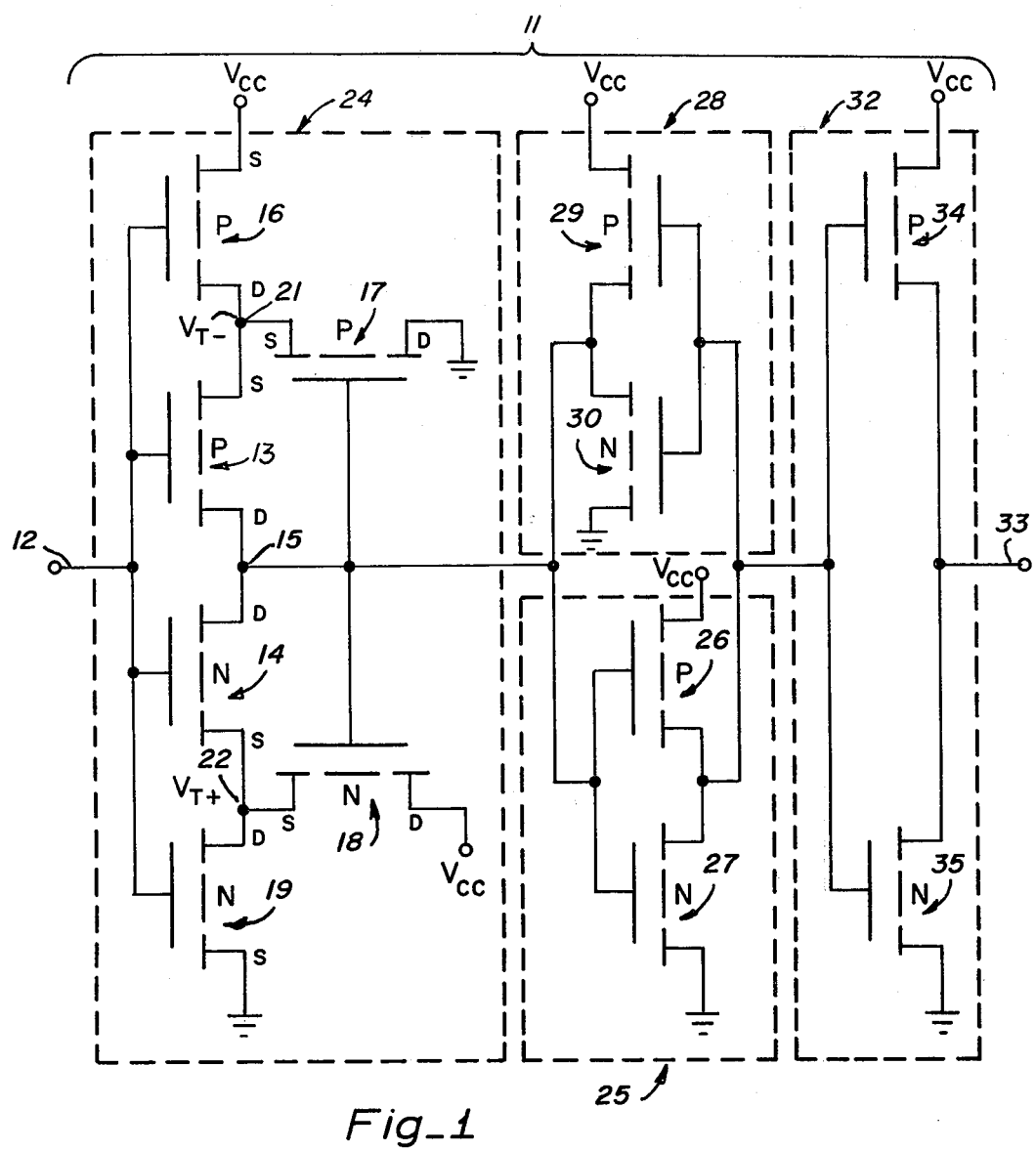
Fig_1
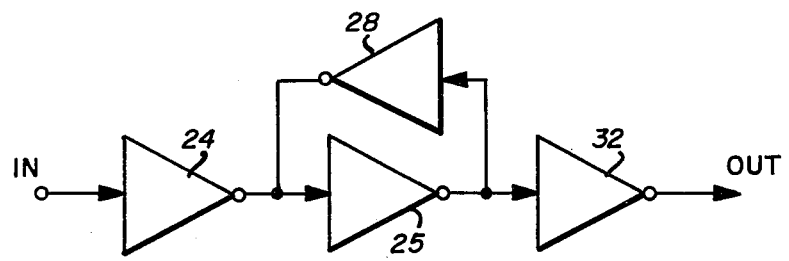
Fig_2

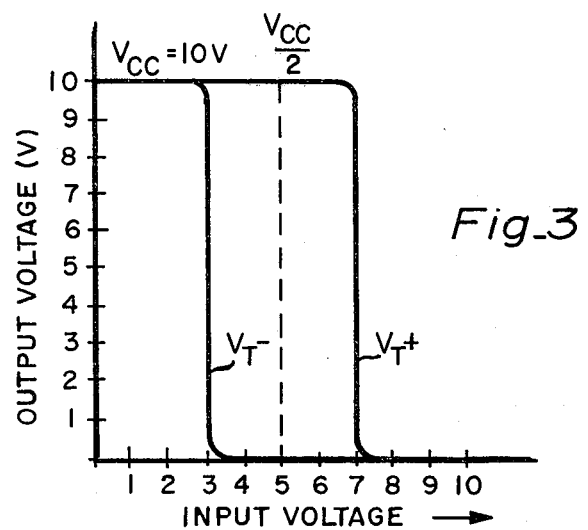
Fig._3
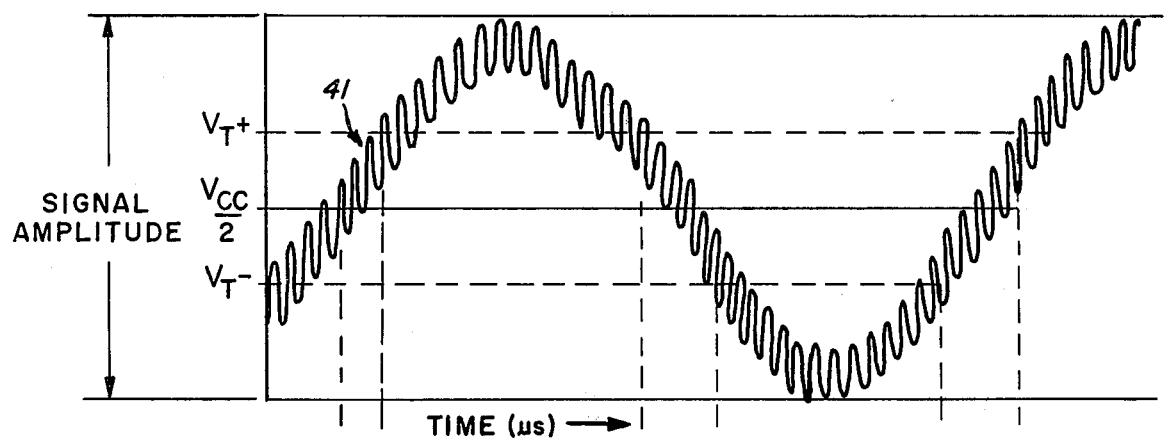
Fig._4
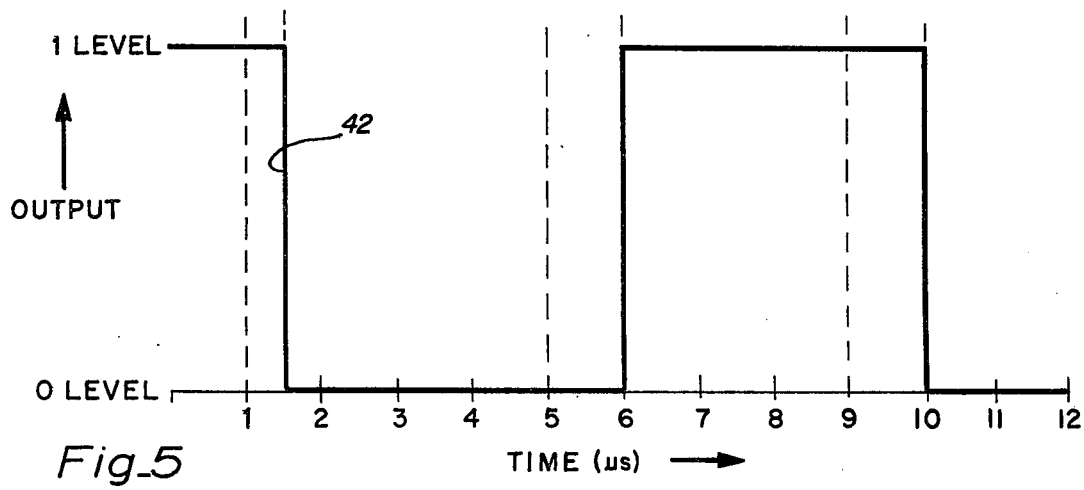
Fig._5

3,984,703

CMOS SCHMITT TRIGGER

BACKGROUND OF THE INVENTION

The present invention relates in general to complementary MOS (CMOS) circuits for deriving transfer functions having hysteresis and, more particularly, to a CMOS Schmitt trigger.

DESCRIPTION OF THE PRIOR ART

Heretofore, CMOS Schmitt triggers have been proposed for deriving a hysteresis transfer function, i.e., a transfer function wherein the output signal level, i.e., a high or low, trips from one state to the other at different levels of the input signal in response to the direction (sign) of the change in the input signal. These prior art circuits have typically employed resistors in a feedback circuit from the output to the input to establish the hysteresis of the transfer function.

The problem with the use of resistors in an integrated circuit is that a resistor uses more die space than an MOS transistor and thus is relatively uneconomical in the use of integrated circuit die space. In addition, these prior devices have had relatively low input impedances which have drawn current from the source during switching. Thus in a noisy environment such prior devices have a substantial power drain. Furthermore, the relatively low input impedances of the prior devices have made it more difficult for these devices to be utilized with moderately high to high impedance input driving sources because in such cases the impedance of the driving source must be taken into account along with the input impedance of the Schmitt trigger in establishing the trip points. Thus the trip points can change as a function of the driving source impedance.

SUMMARY OF THE PRESENT INVENTION

The principal object of the present invention is the provision of an improved CMOS Schmitt trigger.

In one feature of the present invention, the gates of an $n$ channel and a $p$ channel MOS transistor are connected in parallel to an input signal. The source and drain electrodes of the $n$ and $p$ channel transistors are series connected with the drain of the $p$ channel device being connected to the drain of the $n$ channel device to define a circuit node on which the output signal is derived. A trip point reference potential is gated to the source electrode of one of the transistors as a function of the state or level of the output to derive hysteresis in the transfer function.

In another feature of the present invention, the trip point reference potential is applied to the source electrode of one of the series connected CMOS transistors via the intermediary of a source follower transistor having its gate connected to the output signal, whereby the trip point reference potential is established as a function of the level or state of the output signal.

In another feature of the present invention, a $p$ channel transistor is connected as a source follower to the source of the $p$ channel series connected transistor and an $n$ channel source follower transistor is connected to the source electrode of the $n$ channel series connected transistor. The gates of the two source followers are connected to the output for gating the high and low trip point reference potentials to the sources of the series connected $p$ and $n$ channel transistors serving as a comparator network for comparison with the input signal applied to the gates thereof in parallel.

In another feature of the present invention the trip point reference potential to be applied to the stack of $n$ and $p$ channel MOS transistors for deriving one of the trip points is obtained from a voltage divider consisting of a pair of MOS transistors of the same channel type connected in series across a source of potential with the trip point reference potential being derived at a circuit node of the two series connected transistors.

Other features and advantages of the present invention will become apparent upon a perusal of the following specification taken in connection with the accompanying drawings wherein:

BRIEF DESCRIPTION OF THE DRAWINGS

FIG. 1 is a schematic circuit diagram of a CMOS Schmitt trigger incorporating features of the present invention, FIG. 2 is a schematic block diagram of the circuit of FIG. 1, FIG. 3 is a plot of the transfer function for the circuit of FIG. 1 showing the hysteresis effect and the upper and lower trip points, FIG. 4 is a plot of input signal amplitude versus time for a noisy input signal, and FIG. 5 is a plot to the same time scale as that of FIG. 4 showing the resultant Schmitt trigger output signal for the input signal of FIG. 4.

DESCRIPTION OF THE PREFERRED EMBODIMENTS

Referring now to FIG. 1, there is shown the CMOS Schmitt trigger circuit 11 of the present invention. Schmitt trigger circuit 11 includes an input terminal 12 which receives the input signal and couples the signal to a comparator circuit consisting of a $p$ channel MOS transistor 13 and an $n$ channel MOS transistor 14, such transistors 13 and 14 being connected in series across a source of potential $V_{cc}$ to ground as of +3 to +15 volts. Transistors 13 and 14 are connected with their drain electrodes being connected together at output node 15. Trip point potentials $V_{t-}$ and $V_{T+}$ are coupled onto the source electrodes of the respective transistors 13 and 14 via potential divider networks consisting of a pair of $p$ channel transistors 16 and 17, and $n$ channel transistors 18 and 19. Each potential divider is series connected across the source potential $V_{cc}$ to ground. The low threshold reference potential $V_{T-}$ is established at node 21 and is coupled to the source electrode of the $p$ channel transistor 13, whereas the high trip point potential $V_{T+}$ is established at node 22 and which is coupled to the source electrode of $n$ channel transistor 14. $P$ channel transistor 17 and $n$ channel transistor 18 are each connected as source followers with the gates of the respective transistors 17 and 18 coupled to the output node 15, on which the output hysteresis signal is derived.

In operation, when the input signal at terminal 12 is at 0V, $p$ channel transistors 16 and 13 are ON and $n$ channel transistors 14 and 19 are OFF. With p channel transistors 16 and 13 ON, a high level output, i.e., $V_{cc}$, is derived on output terminal 15. This output is coupled to the gate of $p$ channel transistor 17 for holding it OFF. Likewise, the output signal is coupled to the gate of the $n$ channel source follower transistor 18 for holding transistor 18 ON. The drain electrode of the $n$ channel potential divider transistor 19 is also the source of $n$ channel comparator transistor 14 and is at $V_{cc}-V_{th}$, i.e., approximately 8 volts when $V_{cc}$ is +10 volts. As the input signal is increased in amplitude to one threshold above ground potential, $n$ channel potential divider transistor 19 beings to turn ON. With $n$ channel voltage divider transistors 19 and 18 ON, the high reference potential node 22, which is the source of comparator transistor 14, is biased to approximately one-half the supply voltage, i.e., $V_{cc}/2$. When the input signal rises to a threshold above $V_{cc}/2$, $n$ channel comparator transistor 14 begins to turn ON and regenerative switching is about to take over. Any increase in the voltage on the input to transistor 14 causes transistor 14 to be conductive, thereby dropping the potential on the output node 15.

When the potential on the output node 15 drops, the source electrode of $n$ channel source follower transistor 18 follows its gate potential which is the output potential. The influence of source follower transistor 18 in the voltage divider with $n$ channel transistor 19 rapidly diminishes, bringing the output signal down further yet.

Meanwhile $p$ channel source follower transistor 17 started to turn ON, its gate being brought low by the rapidly dropping output potential on node 15. When $p$ channel source follower transistor 17 turns ON this brings the source of $p$ channel comparator transistor 13 low and turns $p$ channel comparator transistor 13 OFF. With comparator transistor 13 OFF, the output signal snaps down to ground potential or to zero level. This snapping action is due to greater than unity loop gain through the stack of transistors 16, 13 14, and 19 caused by positive feedback through the source follower transistors.

When the input signal is brought low again, an identical process occurs in the upper portion of the stack and the snapping action takes place when the lower threshold is reached. More particularly, as the input voltage ramps downward or negative going from a potential above the upper threshold potential, $n$ channel comparator transistor 14 and $n$ channel potential divider transistor 19 are conductive or ON, whereas $n$ channel source follower 18 is OFF. In the $p$ channel, $p$ channel source follower 17 is ON and $p$ channel compartor transistor 13 and $p$ channel potential divider transistor 16 are OFF. With this condition, the potential on the source 21 of the $p$ channel comparator transistor 13 is one threshold above ground or approximately +2 volts. When the input signal drops to one threshold below $V_{cc}$, $p$ channel potential divider transistor 16 beings to turn ON, thereby forming a voltage divider network with the source follower $p$ channel transistor 17 such that a low threshold reference potential of $V_{cc}/2$ is established on reference node 21, i.e., the source electrode of the $p$ channel comparator transistor 13. When the input voltage ramps down to one threshold below $V_{cc}/2$ or approximately 3 volts for a $V_{cc}=+10$ volts, comparator transistor 13 turns ON causing the output potential on node 15 to rise toward $V_{cc}$ causing the $p$ channel source follower transistor 17 to turn OFF and $n$ channel source follower transistor 18 to turn ON. With the $p$ channel source follower transistor 17 turned OFF the output voltage on node 15 snaps to a high level, i.e., $V_{cc}$, and the output on node 15 remains high until such time as the input signal again ramps up in a positive going direction to a value corresponding to the upper threshold potential or upper trip point of +7 volts.

Thus, that portion of the circuit thus far described and shown in the dotted box 24 comprises an inverting amplifier having substantial hysteresis. This hysteresis transfer characteristic is shown in FIG. 3 corresponding to a $V_{cc}$ of +10 volts with the upper and lower trip points being at approximately 7 and 3 volts, respectively.

The output signal derived from node 15 is fed to the input of an inverter 25 consisting of $p$ channel transistor 26 and $n$ channel transistor 27 series connected across the supply voltage $V_{cc}$ and having their input gates connected in parallel to the output node 15. The output of the inverter 25 is fed to the input of a second feedback inverter 28 consisting of series connected $p$ and $n$ channel transistors 29 and 30 with their outputs fed back to node 15 to serve as a latch which stabilizes the output 15. Transistors 29 and 30 are relatively small devices compared to the other devices in the circuitry thus far described.

The output of the inverter 25 is fed through a second buffer inverter 32 to an output terminal 33. The output inverter 32 is a buffer capable of current sinking 360 microamps or two LPTTL loads, not shown. The output inverter 32 consists of a pair of $p$ and $n$ channel transistors 34 and 35 series connected with the supply voltage $V_{cc}$ and with their respective gates coupled to the output of the inverter 25.

Thus, it is seen that the Schmitt trigger circuit 11 of FIG. 1 has a hysteresis transfer function, that is, there is a difference in the output response due to a difference in the direction of input change, i.e., a positive or negative going input. A positive going input signal has a trip point at an upper threshold value, whereas a negative going signal has a lower threshold trip point. Thus, any spurious effects must be greater than the threshold difference to cause multiple transitions of the output. With the Schmitt trigger circuit 11 of FIG. 1 operated at $V_{cc}=10$ volts there is typically 3.6 volts of threshold difference, enough hysteresis to overcome almost any spurious signal on the input.

This effect is shown in FIGS. 4 and 5 wherein a positive going input signal 41 causes the output 42 to switch from a logic 1 or high level to a logic 0 or low level when the input signal rises across the upper threshold of approximately 7 volts. The output stays at 0 level until the negative going input signal 41 falls across the lower threshold $V_{T-}$ of approximately 3 volts, at which time the output switches to the logic 1 or high level and remains high until the positive going input signal crosses the upper or positive threshold $V_{T+}$. Assuming that the input signal is symmetrical relative to $V_{cc}/2$ and is a square wave having a half period of 4 microseconds, it is seen that the square wave is recovered with only a one microsecond delay. The recovered signal 42 is delayed in time but the period is not changed. Thus, noise immunity is achieved and signal distortion is not introduced because of the threshold offset.

Although a preferred embodiment of the Schmitt trigger circuit 11 of FIG. 1 is symmetrical relative to the output node 15 this is not a requirement. One of the offset thresholds relative to $V_{cc}/2$ may be eliminated so that only half of the hysteresis effect is obtained by deleting either the pair of $p$ channel potential divider transistors 16 and 17 or the pair of $n$ channel potential divider transistors 19 and 18 and connecting the source electrode of the $p$ channel comparator transistor 13 or the $n$ channel comparator transistor 14 directly to $V_{cc}$ or ground, as the case may be.

The advantages of the CMOS Schmitt trigger circuit of the present invention are that it provides relatively high input impedance, as of $10^{12}$ ohms and has balanced input output characteristics with thresholds typically symmetrical to $V_{cc}/2$. The output sources and sinks equal currents and the output drives to the supply potentials of $V_{cc}$ and ground. The positive and negative going thresholds show low variation with respect to temperature. A wide range of supply poentials may be employed as of 3 to 15 volts and split supplies may be utilized. The circuit provides low power consumption even during transitions and has relatively high noise immunity, i.e., 0.70 $V_{cc}$ being typical.

What is claimed is:

1. In a method for employing CMOS transistors for deriving a transfer function having hysteresis, the steps of:

coupling the drain electrode of a p channel MOS transistor, having gate, source and drain electrodes, to the drain electrode of an adjacent n channel MOS transistor, having gate, source and drain electrodes, to form a circuit node at the coupling of said two drain electrodes on which the hysteresis output signal is to be derived;

coupling the gates of said coupled p and n channel MOs transistors together to receive the input signal and for applying the input signal in parallel to said p and n channel MOS transistors for comparison with potentials to be established on said source electrodes of said p and n channel transistors to derive the output signal having a high or low state;

coupling a first trip point reference signal as a function of the state of the output signal into said source electrode of one of said p and n channel transistors for comparison with the input signal applied to said gates of said n and p channel transistors for establishing a first trip point for the output signal; and coupling a second trip point reference potential onto said source electrode of the other one of said p and n channel transistors for comparison with the input signal for establishing hysteresis in the transfer function of said coupled transistors depending upon whether the output is positive going or negative going.

2. The method of claim 1 wherein the step of coupling the second trip point reference signal to the source electrode of said other transistor comprises, coupling said second trip point reference signal to said source electrode as a function of the state of said output signal.

3. The method of claim 1 including the step of, amplifying the output signal and feeding back a portion thereof as positive feedback to said output circuit node for stabilizing the output signal on said output node.

4. In a CMOS Schmitt trigger:

p and n channel type MOS transistor means each having gate, source and drain electrodes and being coupled with their source and drain electrodes in series with each other and with at least one of said p channel MOS transistor means having its drain electrode coupled to said drain electrode of an adjacent n channel MOS transistor means to form a circuit node on which a hysteresis output signal is derived;

means for coupling said gate electrodes of said p and n channel MOS transistor means together in parallel with each other to receive an input signal for comparison with potentials established on said source electrodes of said p and n channel MOS transistor means for determining the trip points in said output signal corresponding to switching thereof between a high and a low state;

first reference means responsive to the state of said output signal for coupling a first trip point reference signal onto said source electrode of one of said p and n channel MOS transistor means for comparison with said input signal applied to said gates of said p and n channel MOS transistor means for establishing a first trip point for said output; and second reference means for coupling a second trip point reference potential onto said source electrode of the other one of said p and n channel transistor means for comparison with said input signal to establish a second trip point in said output signal which differs from said first trip point depending upon the sign of the change in said input signal.

5. The apparatus of claim 4 wherein said second reference means for coupling said second trip point reference signal onto said source electrode of the other one of said p and n channel MOS transistor means couples said second trip point reference signal onto said other one of said transistors as a function of the state of said output signal.

6. The apparatus of claim 4 wherein said first reference means includes potential divider network means including a third MOS transistor means, having gate, source and drain electrodes, with said gate thereof being responsive to said output signal for applying said first reference signal from said potential divider network means to said source electrode of said one MOS transistor means in response to the state of said output signal.

7. The apparatus of claim 6 wherein said potential divider network means includes a fourth MOS transistor means of the same channel type as that of said third transistor means and having gate, source and drain electrodes, with said drain of said fourth MOS transistor means being coupled to said source electrode of said thrid MOS transistor means to form a first reference output node therebetween on which is developed said first reference signal to be coupled onto said source electrode of said one transistor means.

8. The apparatus of claim 7 wherein said second reference means includes, second potential divider network means including a fifth MOS transistor means, having gate, source and drain electrodes, said output signal being coupled to said gate electrode of said fifth MOS transistor means for causing said fifth transistor means to be responsive to said output signal for coupling said second reference signal from said potential divider network means to said source electrode of said other MOS transistor means in response to the state of said output signal, and wherein said second potential divider network means includes a sixth MOS transistor means of the same channel type as that of said fifth transistor means, and having gate, source and drain electrodes, with said drain electrode of said sixth MOS transistor means being coupled to said source electrode of said fifth MOS transistor means to form a second reference output node therebetween on which is developed said second reference signal to be coupled onto said source electrode of said other transistor means.

9. The apparatus of claim 4 wherein said second reference means includes, potential divider network means including a third MOS transistor means, having gate, source and drain electrodes, said output signal being coupled to said gate electrode of said third MOS transistor means for causing said third transistor means to be responsive to said output signal for coupling said second reference signal from said potential divider network means to said source electrode of said other MOS transistor means in response to the state of said output signal.

10. The apparatus of claim 9 wherein said potential divider network means includes, a fourth MOS transistor means of the same channel type as that of said third transistor means, and having gate, source and drain electrodes, which said drain electrode of said fourth MOS transistor means being coupled to said source electrode of said third MOS transistor means to form a second reference output node therebetween on which is developed said second reference signal to be coupled onto said source electrode of said other transistor means.

* * * * *